United States Patent Office 3,482,974
Patented Dec. 9, 1969

3,482,974
METHOD OF PLATING GOLD FILMS ONTO OXIDE-FREE SILICON SUBSTRATES

Max Metlay and Donald L. Schaefer, Schenectady, N.Y., assignors to General Electric Company, a corporation of New York No Drawing. Filed Dec. 27, 1966, Ser. No. 604,603
Int. Cl. C23c 17/02
U.S. Cl. 96—35 2 Claims

ABSTRACT OF THE DISCLOSURE

A method for sequentially removing an oxide film from the surface of an elemental silicon body and photoplating a layer of metal on the cleaned surface all in the same liquid solution, thereby preventing the formation of an oxide film between the surface of the silicon and the plated metal layer.

This invention relates to the manufacture of oxide-free metallic electrical contacts to elemental silicon bodies and more particularly to a method for providing bodies of silicon for use in silicon controlled rectifier circuits or as transistors, for example, with metallic electrical contacts which do not have an intervening layer of silicon dioxide. In the practice of this invention, utilization is made, as will appear in greater detail subsequently, of the photoplatng process as disclosed in copending application Ser. No. 604,596, filed concurrently herewith in the names of Donald L. Schaefer and James F. Burgess, entitled "Photodeposition of Metal" and assigned to the assignee of the present application.

BACKGROUND OF THE INVENTION

In the manufacture of semiconductive devices utilizing silicon, it is customary to employ wafers of elemental silicon, usually in the form of disk-like bodies, frequently about one inch in diameter and about 0.1 inch or less in thickness. These wafers are treated in many ways in order to produce optimum semiconductive properties in the silicon and, not infrequently, it is desired to produce patterns in the silicon which have different electrical characteristics. After these patterns have been produced in the wafer, it is necessary to provide these pattern elements with electrical contacts. For example, one method which has been employed to produce a pattern in a silicon wafer is to uniformly oxidize the surface to be treated to produce a uniform layer of $SiO_2$ thereover. A conventional photoresist copy of the pattern is then developed on the oxide surface which comprises soluble zones in the photoresist material overlying zones of the oxide corresponding to the desired pattern and insoluble zones overlying zones of the oxide which are not to be treated. The soluble material is removed and the exposed oxide in the zones of the pattern is then removed with hydrofluoric acid, exposing the underlying silicon which is not attacked by the acid. The pattern in the exposed silicon is then treated as desired such as for example, by diffusing a doping agent therein, and conducting electrodes applied to the pattern by suitably masking portions of the pattern and evaporating gold, for example, onto the areas of the pattern where contacts are desired. The unwanted photoresist pattern, masks, and silica may then be removed in preparation for subsequent treatment if desired. Unless considerable care is taken, the exposed surface of the silicon in the zones where the $SiO_2$ film is removed to form the pattern will become contaminated by atmospheric oxygen to form an oxide layer up to 50 A. thick before the contacts can be applied which is a highly undesirable occurrence.

It is therefore a principal object of this invention to prevent the formation of an oxide film on the exposed surfaces of such silicon bodies prior to the application of electrical contacts thereto.

It is a further object of this invention to provide a method for sequentially removing silica from the surface of a silicon body and applying a metallic plate on predetermined areas of the oxide-free surface while preventing the formation of a new oxide layer before and during the plating operation.

It is a yet further object of this invention to photodeposit metallic electrode contacts on the surface of oxide-free silicon by the photodecomposition of a source of the metal in a liquid solution which includes an etchant for the oxide of silicon.

Other and specifically different objects of the invention will become apparent to those skilled in the art from the description which follows.

SUMMARY OF THE INVENTION

Briefly stated, and in accordance with one aspect of the invention, an oxidized silicon wafer is immersed in a photoplating solution containing a small amount of hydrofluoric acid so that the surface to be etched is covered by the solution to a uniform depth of about 0.1 inch or less. After the surface has been cleaned by the action of the acid, metal electrode contacts are deposited by exposing the areas of the surface desired to be plated to activating radiation in accordance with the disclosure of the aforementioned copending patent application. It will be appreciated that if the wafer has been previously uniformly oxidized to produce a relatively thick oxide layer, the oxide layer etched to form a pattern comprising unetched areas of oxide and areas in which the oxide has been removed, the areas from which the thick oxide coating has been removed then treated by doping, for example, and then a relatively thin oxide layer produced in those areas by contamination, that the process may be used to remove the contamination layer and electrical contacts photoplated on the desired portions of the cleaned pattern surface without substantially attacking the relatively thick oxide layer portions comprising the pattern.

DESCRIPTION OF THE PREFERRED EMBODIMENT

More specifically, the following working example of the invention will clearly demonstrate how the invention may be practiced. A solution of about 0.1 N-chlorosuccinimide (NCS) in methanol was prepared and metallic gold immersed therein and exposed to the radiation of a high pressure 200 watt xenon lamp for a few minutes to prepare a stock solution. A surface oxidized silicon wafer was supported in open top waxed dish with the surface to be treated horizontally arranged. Hydrofluoric acid was added to a portion of the stock solution in an amount of about 1 or 2 milliliters of HF to 100 milliliters of solution. The acid solution was poured into the dish to a depth which provided a uniform layer of solution less than 0.1 inch over the upper surface of the wafer. After about 10 to 15 minutes the oxide film was removed from the surface of the wafer and selected zones of the clean silicon surface where subjected to radiation from a high pressure 200 watt xenon light source for about 15 minutes. When the exposure was complete, the wafer was found to have plated thereon electrically conductive gold contacts in the areas which had been illuminated without having been exposed to and contaminated by atmospheric oxygen. Not only does the foregoing process produce non-contaminated electrical contacts, but the need for expensive evaporation equipment and the attendant masking and mask removal steps are eliminated.

While for many applications gold is the preferred contact material, other metals such as, for example, nickel and copper may be substituted therefor in the photoplating technique as disclosed in the previously identified copending patent application with similarly advantageous results.

It will be apparent from the foregoing to those skilled in the art that other variations may be made within the scope of the invention. It is therefore not intended to limit the invention except as defined by the following claims.

What we claim as new and desire to secure by Letters Patent of the United States is:

1. The method of plating coherent gold films upon silicon substrates comprising the steps of providing a liquid containing a photodecomposable source of gold in solution, adding a small but effective amount of hydrofluoric acid to said solution, covering the substrate surface to be plated upon with said liquid solution to dissolve silicon oxides present on said substrate surface, and while still covered with said solution illuminating selected areas of said substrate surface with activating radiation to photodecompose said gold source and plate a gold film upon said oxide-free silicon surface of the substrate in the selected areas.

2. The method recited in claim 1 wherein said liquid consists essentially of gold and N-chlorosuccinimide.

References Cited

UNITED STATES PATENTS

| | | | |
|---|---|---|---|
| 3,013,955 | 12/1961 | Roberts | 117—93.3 X |
| 3,223,525 | 12/1965 | Jonker et al. | 96—36.2 |
| 3,281,264 | 10/1966 | Cape et al. | 204—157.1 X |
| 3,255,005 | 6/1966 | Green | 69—36 |

FOREIGN PATENTS

| | | | |
|---|---|---|---|
| 1,126,250 | 9/1968 | Great Britain. | |

GEORGE F. LESMES, Primary Examiner

R. E. MARTIN, Assistant Examiner

U.S. Cl. X.R.

96—36, 36.2, 38.4; 117—93.3